(12) United States Patent
Schachner et al.

(10) Patent No.: US 6,269,317 B1
(45) Date of Patent: Jul. 31, 2001

(54) SELF-CALIBRATION OF AN OSCILLOSCOPE USING A SQUARE-WAVE TEST SIGNAL

(75) Inventors: Joseph M. Schachner, Suffern, NY (US); Viktor Hungerbuehler, Satigny (CH)

(73) Assignee: LeCroy Corporation, Chestnut Ridge, NY (US)

( * ) Notice: Subject to any disclaimer, the term of this patent is extended or adjusted under 35 U.S.C. 154(b) by 0 days.

(21) Appl. No.: 09/066,167

(22) Filed: Apr. 24, 1998

Related U.S. Application Data

(60) Provisional application No. 60/044,300, filed on Apr. 30, 1997.

(51) Int. Cl.$^7$ .................................................. G01D 1/10
(52) U.S. Cl. .................................. 702/91; 324/94; 329/97
(58) Field of Search ........................ 702/67, 91; 324/94, 324/121 R; 329/97

(56) References Cited

U.S. PATENT DOCUMENTS

| | | |
|---|---|---|
| D. 335,093 * | 4/1993 | Holmen et al. ................. D10/76 |
| 4,345,241 | 8/1982 | Takeuchi et al. . |
| 4,627,268 | 12/1986 | Chu . |
| 4,736,189 | 4/1988 | Katsumata et al. . |
| 4,763,105 * | 8/1988 | Jenq ................................... 340/347 |
| 4,768,017 | 8/1988 | Gordon . |
| 4,843,309 | 6/1989 | Kareem et al. . |
| 4,940,931 * | 7/1990 | Katayama et al. ................ 324/121 |
| 4,962,380 * | 10/1990 | Meadows ........................... 341/120 |
| 5,055,845 | 10/1991 | Ridkosil . |
| 5,239,299 | 8/1993 | Apple et al. . |
| 5,488,369 | 1/1996 | Miller . |
| 5,521,599 | 5/1996 | McCarroll et al. . |
| 5,621,310 * | 4/1997 | Cosgrove et al. ..................... 324/74 |

FOREIGN PATENT DOCUMENTS

| | | |
|---|---|---|
| 0 298 618 | 1/1989 | (EP) . |
| 0 554 973 | 8/1993 | (EP) . |
| 9-166 623 | 6/1997 | (JP) . |
| WO 88/04059 | 6/1988 | (WO) . |

* cited by examiner

Primary Examiner—Kamini Shah
Assistant Examiner—Edward Raymond
(74) Attorney, Agent, or Firm—Frommer Lawrence & Haug, LLP; William S. Frommer; Gordon M. Kessler

(57) ABSTRACT

Self-calibration of a digitizer is carried out by using a square-wave test signal which is digitized by the digitizer, and temporal positions of the digitized values output by the digitizer are compared to respective reference periods of the test signal. The results of the comparison operations are then used by a microprocessor to calculate a time delay for adjusting a clock signal supplied to the digitizer.

14 Claims, 3 Drawing Sheets

SELF-CALIBRATION OF AN OSCILLOSCOPE USING A SQUARE-WAVE TEST SIGNAL

This application claim benefit to provisional application 60/044,300 Apr. 03, 1997.

BACKGROUND OF THE INVENTION

The present invention is related to calibration of test equipment and, in particular, to calibration of a digitizer in an oscilloscope, for example, using a square-wave test signal, whereby a time delay for adjustment is calculated by a microprocessor on the basis of the digitized square-wave test signal.

It is well known that a digitizer comprising, for example, a Sample-and-Hold (S/H) circuit and an analog-to-digital (A/D) converter, converts an analog signal to digital form. Due to the instantaneous changes of voltage in the input analog signal, the S/H circuit periodically samples the signal, in response to a clock signal, at particular points in time and holds (stores) a sampled voltage value to be input to the A/D converter. The A/D converter receives the sampled voltage value from the S/H circuit and obtains a digital representation based on a predetermined resolution (8 bits, 16 bits, etc.). If converted at least at the Nyquist rate, the analog signal is accurately represented by digital values and may be processed then by digital signal processing elements. Of course, the higher the frequency of the digitizer in performing the sampling, holding and converting operations as described hereinabove, the better the approximation between the input analog signal and its digital representation.

In today's fast-paced world emphasizing ever increasing speed and processing, many analog signals have frequency components which would require a very fast digitizer to convert the analog signal to digital form. Such digitizers are typically quite expensive and may be cost prohibitive for certain applications. As a result, it has been suggested to use several digitizers, whereby digital values representing the analog signal are interleaved (time-multiplexed). For example, a digitizer, operating at a frequency F/2, acquires the input analog signal at times t1, t3, t5, t7 . . . and generates respective digital values D1, D3, D5 . . . of the analog signal; while another digitizer, also operating at the frequency F/2, acquires the analog signal at times t2, t4, t6 . . . and generates digital values D2, D4, D6 . . . of the same analog signal. It is apparent that the two digitizers acquire the analog signal for conversion at different times, and specifically the analog signal is sampled by the second digitizer between the sampling operation of the first digitizer (and vice versa). If the digital values from the two digitizers are interleaved, the analog signal is represented by the digital values D1, D2, D3, D4, D5, D6, D7 . . . As a result, the effective sampling frequency of the analog signal is F, even though individual sampling frequencies of the digitizers are F/2.

Proper operation of multiple digitizers employed in the above-described interleaved manner in digital oscilloscopes, for example, depends on a very precise timing. Among other things, clock signals supplied to the digitizers should be accurately controlled to achieve a predetermined phase shift. In the above example, the conversion of the analog signal to the digital values D2, D4, D6 by the second digitizer should occur precisely between the digital values D1, D3, D5, D7 generated by the first digitizer. That is, the digitizers should be triggered with clock signals having a high accuracy. The accuracy of clock signals that generate triggers for the digitizers becomes even more important when the number of digitizers operating in the interleaved mode increases. As the interval between the interleaved samples decreases, the accuracy of the trigger clock must increase to generate accurate interleaved digital values.

In addition to clock signals, other factors such as temperature, humidity, physical characteristics of current conduits, etc. may affect the timing of the digitizers operating in the interleaved mode. In contrast to the clock signals generated by oscillators that may be manufactured with high precision albeit very expensively, the above-mentioned additional factors that influence the operation of the digitizers may be difficult to control. Periodic calibration (adjustment) of the digitizers is, therefore, necessary to obtain accurate digital values representing the analog signal. It is therefore imperative that the calibration of the digitizers should be performed quickly, accurately and without excessive hardware increasing the cost of the device or system.

A need therefore exists for a device and method for realizing the above criteria.

OBJECTS OF THE INVENTION

It is an object of the present invention to provide self-calibration of an oscilloscope.

It is another object of the present invention to calibrate a digitizer using a square-wave test signal.

It is a further object of the present invention to adjust a digitizer in test equipment without adding significant additional hardware or time-consuming software calculations.

SUMMARY OF THE INVENTION

These and other objects, features and advantages are accomplished by apparatus for performing calibration. The inventive apparatus includes a signal generator for generating a reference signal having a preselected period; a digitizer for digitizing the reference signal to produce digitized values having respective amplitudes; and a programmable controller for obtaining, in each respective period, a temporal position of a digitized value with respect to a corresponding period of the reference signal. The programmable controller is operative to determine, based on the obtained temporal positions, a delay corresponding to an approximate median value of the amplitudes such that sampling times of the digitizer are adjusted on the basis of the determined delay.

In accordance with one aspect of the present invention, the inventive apparatus further comprises a time base circuit for providing a clock signal to the digitizer to start the digitizing operation. The time base circuit is controlled by a control signal which is supplied by the programmable controller. Based on the determined delay, the timing of the clock signal is adjusted in response to the supplied control signal.

BRIEF DESCRIPTION OF THE DRAWINGS

The above-mentioned as well as additional objects, features and advantages of the present invention will become readily apparent from the following detailed description thereof which is to be read in conjunction with the accompanying drawings, in which.

In all Figures, like reference numerals represent the same or identical components of the present invention.

DETAILED DESCRIPTION OF THE PREFERRED EMBODIMENTS

As a general overview, the present invention is directed to a self-calibration procedure in a digital oscilloscope with at least two digitizers per channel operating in an interleaved manner (so-called interleaved digitizers). The self-calibration procedure is performed by supplying a test waveform (reference signal) having a predetermined frequency to the channel digitizers. The test waveform is digitized, and the digital values are selected within a certain amplitude range. The delay of the selected digital values (that is, the actual samples of the test waveform) is measured with respect to the reference period (that is, the theoretical or reference period of the test waveform). Based on the measured delay, an estimate of the sensitivity of the delay is obtained. To realize the calibration, the clock signal triggering the sampling operation of the digitizers is adjusted in response to the estimated delay.

Figure 1:
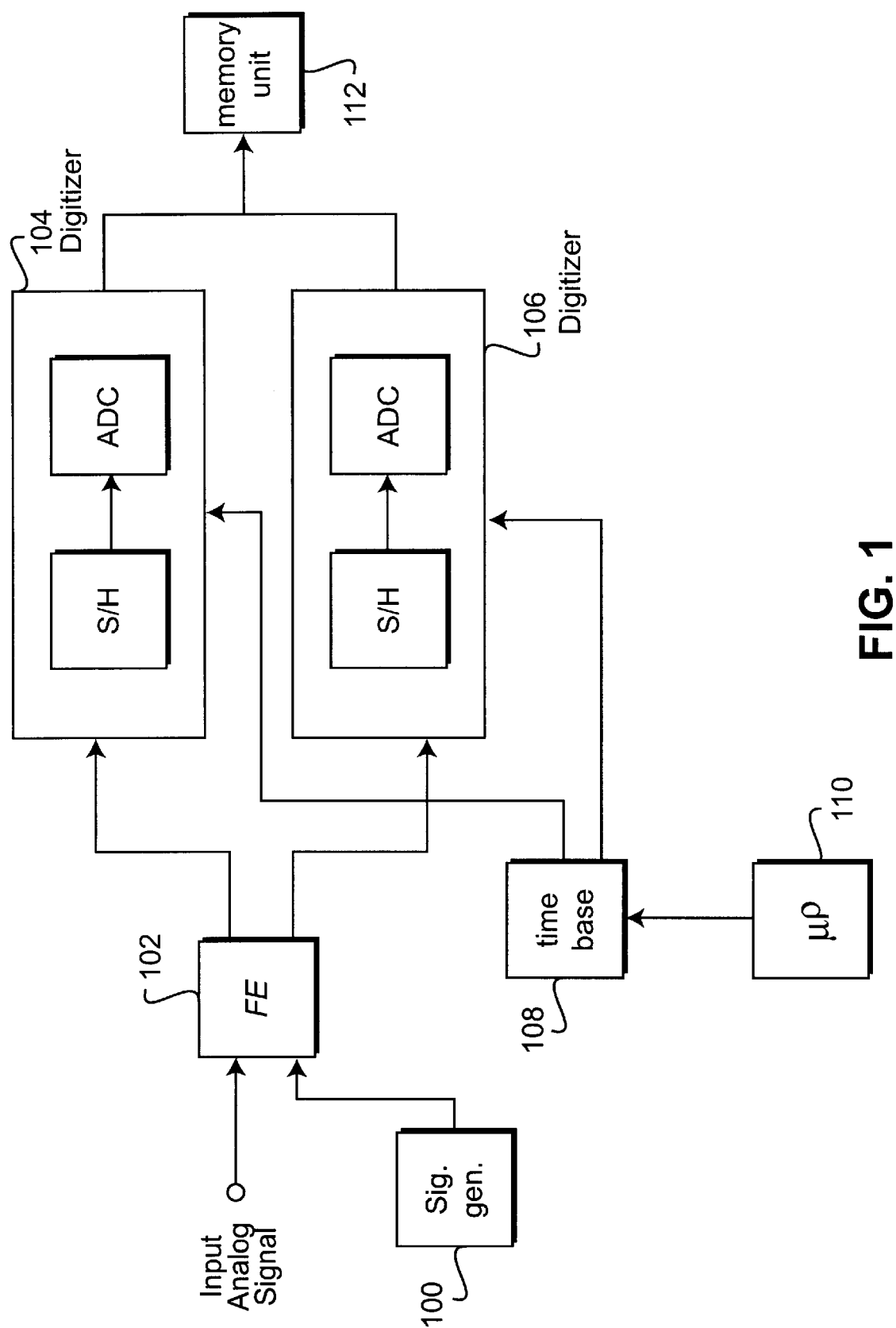
FIG. 1 is a block diagram of calibration apparatus in accordance with the present invention.

The present invention will now be discussed in detail with reference to the accompanying drawings. A block diagram of a single channel in a digital oscilloscope according to the present invention is shown in FIG. 1 while its operation will be explained on the basis of FIGS. 2a–c. In order not to obscure the inventive concept, only selected elements are illustrated in the drawings. Since elements of the oscilloscope that are not shown in the drawings are well known to those skilled in the art, the description thereof will be omitted to avoid verbosity.

FIG. 1 shows a signal generator 100 for generating a test waveform (the reference signal). According to one aspect of the present invention, the generated test waveform is a square-wave signal of a predetermined frequency which is not a multiple of the sampling rate of the digitizers. It is important that the frequency of the square-wave signal not be harmonically related to the sampling rate of the digitizers for the reason explained hereinbelow.

As shown in FIG. 1, the square-wave signal from the signal generator 100 is supplied to a front end (FE) unit 102. The front end unit comprises one or more of the following components: an attenuator for attenuating the signal amplitude, a switch for switching the input between a test waveform and an actual input signal, a coupler for providing AC coupling of the signal, and other components as known to those skilled in the art. Also supplied to the front end unit 102 is an input analog signal as illustrated in FIG. 1. As mentioned above, the switch (not shown) in the front end unit 102 selects the test waveform from the signal generator 100 when the oscilloscope is in the calibration mode. Otherwise, the input analog signal is supplied to the front end unit 102 for subsequent processing in accordance with a typical operation of the oscilloscope including the measurement and display of signal, for example.

Further shown in FIG. 1 are two digitizers 104, 106 selectively receiving substantially simultaneously either the input analog signal or the test waveform from the front end unit 102. Each digitizer representatively includes a Sample-and-Hold (S/H) circuit for sampling the instantaneous signal voltage and for storing the samples to prevent ambiguity during the subsequent conversion if the signal voltage changes abruptly. Also included in the digitizer is an Analog-to-Digital (A/D) converter for converting the samples received from the S/H circuit to digital form. The digital values produced by the A/D converter in each digitizer 104, 106 are stored in a memory unit 112 for subsequent processing by the system. Although the memory unit 112 is shown as a single element, it is understood that other embodiments of the present invention may include separate memory units for each digitizer, for example.

The digitizers 104, 106 are driven by a clock signal generated by a time base circuit 108. Namely, each digitizer 104, 106 is activated by a signal from the time base circuit 108 as the interleaving of digital values supplied to the memory unit 112 is based on the clock signal alternately triggering the digitizers 104, 106. As mentioned above, the digitizers 104, 106 must be clocked at precise timing if a proper interleaving operation is to be carried out. As a result, it is necessary to perform a periodic calibration of the digitizers including the adjustment of clock signals. The clock signals may be delayed or advanced under control of a microprocessor 110, such as a central processing unit (CPU) or a programmable controller.

Figure 2A:
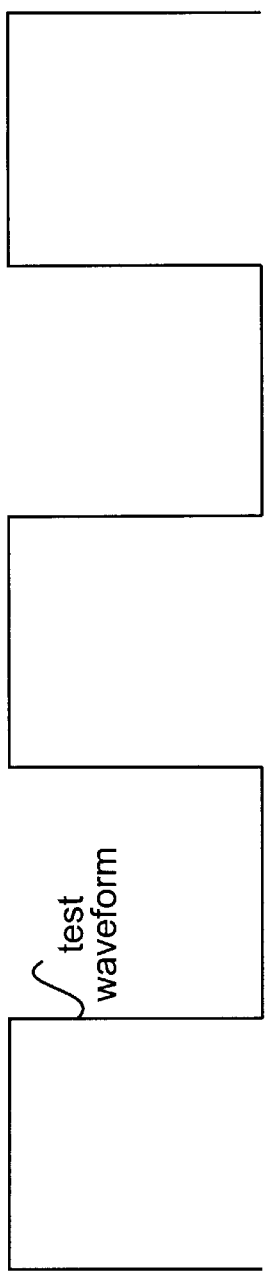
FIG. 2a–2c illustrate operation of the calibration apparatus of FIG. 1.

In operation, the front end 102 is operative to select the square-wave signal (test waveform) generated by the signal generator 100 during the calibration procedure as shown in FIG. 2a. In actual implementation, the square-wave signal has a rising edge of approximately 350 psec., 20% to 80% amplitude level, when the channel is in high impedance coupling; at least several hundred cycles of the test waveform are obtained for calibration.

Figure 2B:
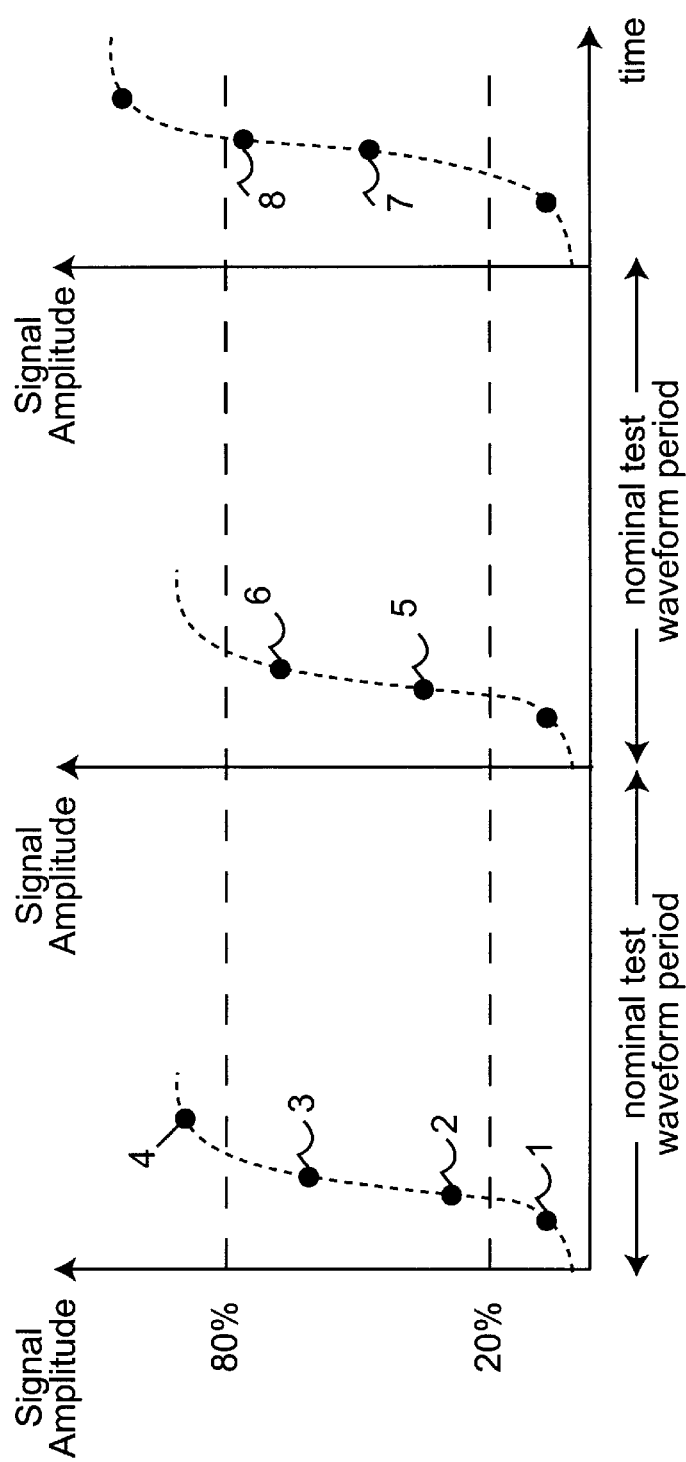

After the square-wave signal is acquired (digitized), the relative delays of the digitizers 104, 106 are determined. That is, a temporal position of a digitized value is calculated with respect to a corresponding period of the reference signal. In particular, FIG. 2b shows successive time periods of the theoretical (reference) test waveform and the digital representation of the actual test waveform as produced by the digitizers 104, 106. The top and base of the actual test waveform are determined by the microprocessor 110 using histogram techniques. To eliminate the effects of ringing or unsettled signal, only digital values within an amplitude range of 20–80% are selected from the actual test waveform. As shown in FIG. 2b, digital values 2, 3 from one period of the test waveform are selected by the microprocessor 110, while digital values 1, 4 are rejected. Similarly, digital values 5, 6, 7, 8, etc. are extracted during the subsequent periods of the test waveform.

Following the extraction of the digital values, the microprocessor 110 calculates the relative delays of the digitizers 104, 106 with respect to the theoretical test waveform periods as illustrated in FIG. 2b. The extracted digital values with the corresponding test waveform cycle are maintained by the microprocessor 110. The period, slope and delay of each extracted digital value are calculated, and then the cycle number of the test waveform is subtracted from each digital value. As a result, all of the digital values are normalized (overlaid onto the edge as represented by a linear fit).

As mentioned earlier, the frequency of the square-wave signal should not be harmonically related to the sampling rate such that the reference signal has to slip phase relative to the sampling period of the digitizer. By observing this condition, the edge is populated evenly with samples (digital values).

Figure 2C:
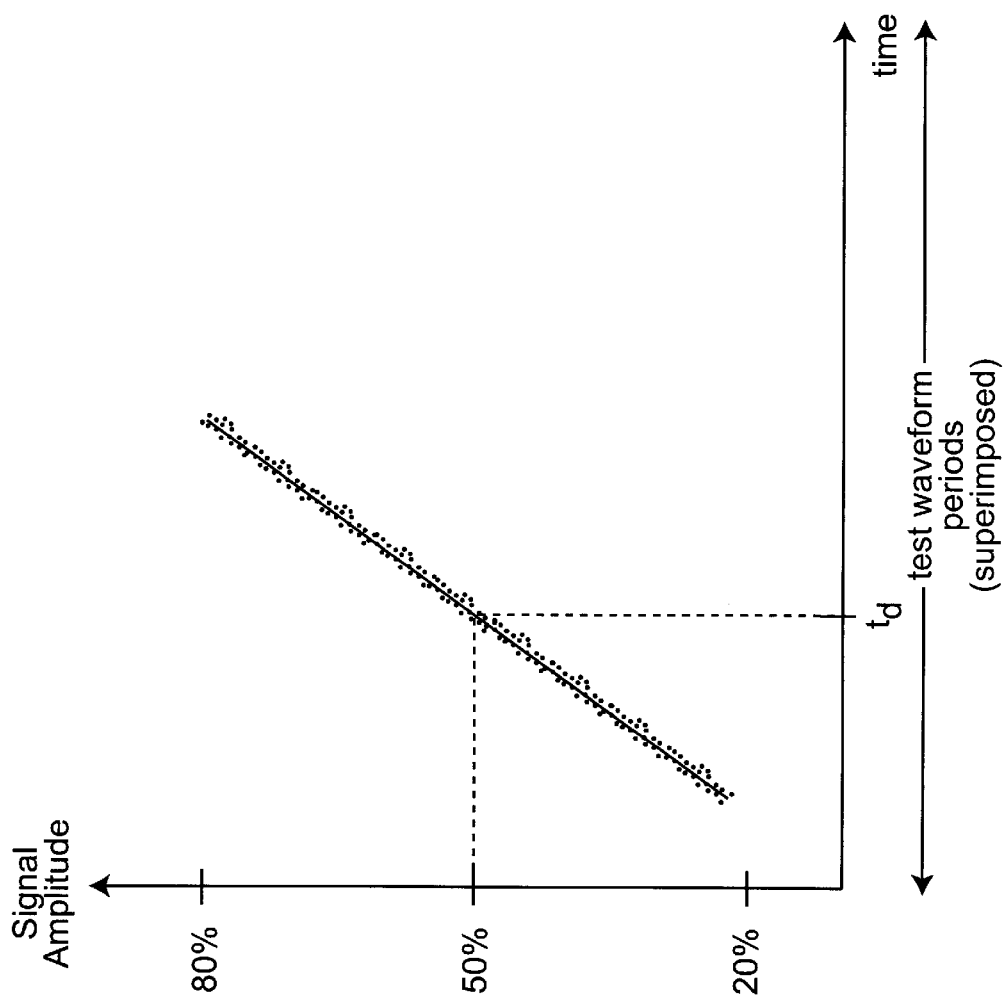

The above procedure may be best explained by using an illustration of FIG. 2c. The selected digital values within each cycle (period) of the reference test waveform are represented by points, and are plotted on a graph of FIG. 2c. It is as if all of the cycles (periods) of the reference test waveform in FIG. 2b have been overlaid on top of each other. When the points from each respective overlaid period are plotted in a single period, the digital values represented by those points form a so-called "cloud" as shown in FIG.

2c. In the actual implementation, approximately 200 digital values are maintained by the microprocessor 110, and a straight line is then fitted through the points on the graph as shown in FIG. 2c. The location on the line defining a 50% signal amplitude corresponds to the delay of the digitizers 104, 106 as represented by $t_d$ in FIG. 2c.

The above operation may be performed several times until the time delays stop converging. If, however, after several iterations as described hereinabove the time delays do not converge, the calibration may not be possible. In this situation, a display message indicating that the calibration procedure cannot be performed successfully is generated to notify the operator of the failed attempt.

Following the determination of the relative delay based on the preselected number of iterations, the microprocessor 110 controls the time base 108 accordingly in order to adjust the clock signals that trigger the operation of the digitizers 104, 106.

The following description provides mathematical details of the calibration procedure in accordance with the present invention.

Acquired Test Waveform

At least several hundred cycles of the test waveform are acquired for each analog-to-digital converter (ADC). The test waveform spans about 5 divisions on the oscilloscope when the front end is set to 50 mV/div. It is expected to be an approximately square-wave with a frequency of 14.31818 MHz and with a rise/fall time of 1 ns or less. The algorithm is designed to make use of either slope (but NOT both simultaneously), and the final choice is based on performance.

The acquired waveform points are labelled X(l(i)), wherein l(i) is the index of the points of a single ADC i(i=0.1 ... (NADC-1))). l(i) runs from 0 to L-1, and L is the total number of data points in the record of each ADC.

Gain + Offset Adjustment

The top and base of the calibration signal from each digitizer is found using histogram techniques. From this the 20%, 80% and median levels for each digitizer are computed. Ideally the gain and offsets already match, but finding separate levels insures that any remaining mismatch does not translate into a delay error.

The corrected ADC values, relative to median level, will be referred to as call Y(i).

Fit to the Waveform Edges

This analysis is individual for each participating ADC. Thus, the mathematics are common for each fit, and it is not necessary to refer to the ADC explicitly in the formulas.

A) Find the data values of the ADCs which lie on a given slope (whether to use the positive or the negative slope is determined later), resulting in the following data values:

Y(k) where the index k runs over all points ON THE SLOPE for the ADC i, 0<=k<K. K is the number of points which the ADC has on the slope.

The algorithm for finding Y(k) includes following the acquired test waveform and retaining only those values which satisfy:

$$\{BASE+a*(TOP-BASE)\}<Y(k)<\{TOP-a*TOP-BASE)\}$$

and which are on either the rising or falling slope (this is determined by checking whether preceding values are either close to BASE or to TOP). BASE, TOP are determined for each ADC individually; a is typically between 0.1 and 0.2 (a fixed value is selected at implementation).

B) For each useful data point, the following values can be determined:

j the sample number (j=0 ... number of points in record);

n the number of iterations of the test signal;

These values are indexed by the same index which labels the data values, k. However, this index will not be explicitly written in the following equations.

C) The data points must now be fitted to a multitude of linear equations, which represent many (rising or falling) slopes observed in the test waveform:

$$V=A*(t-\text{tzero})$$

where

A=slope of the waveform (ADC codes per nsec)

t=sampling time (in nsec)

=s*j where j=sample number s=sampling interval (in nsec)

tzero=transition time (in nsec) of the fitted slope through the origin of the ADC (i.e., code 0000). This time is different for every test waveform slope.

$$=(p+e)*n+d$$

where p=nominal test signal period (in nsec)

e=deviation of real test signal period from nominal (reference) test signal period (in nsec)

n=iteration number of test signal d=ADC time shift (in nsec)

It is noted that j, n are determined for every useful data point, s, p are constants (an error in s is not very important, because s just provides the time scale) e, d are determined by the fit $$V=A*(s*j-p*n-e*n-d)$$

$$V=A*r-E*n-D \text{ with } r=s*j-p*n$$

ti $E=A*e$ $D=A*d$

The useful data values Y(k) must now be fitted to the expression above, in order to determine the 3 unknowns, A, E and D. Below, the following abbreviations are used:

| | |
|---|---|
| $SR = \text{SUM}(k)\{r*r\}$ | $SN = \text{SUM}(k)\{n*n\}$ |
| $NR = \text{SUM}(k)\{n*r\}$ | $YR = \text{SUM}(k)\{Y(k)*r\}$ |
| $YN = \text{SUM}(k)\{Y(k)*n\}$ | |
| $R = \text{SUM}(k)\{r\}$ | $N = \text{SUM}(k)\{n\}$ |
| $K = \text{SUM}(K)\{l\}$ | $Y = \text{SUM}(k)\{Y(k)\}$ |

Note that K is the number of (useful) data points.

$$A*NR-E*SN+N*(Y-A*R+E*N)/K=YN$$

which can be reformatted for the 2 unknowns A and E $$A*SR'-E*NR'=YR'$$

$$A*NR'-E*SN'=YN'$$

where the following new variables are used:

$$SR' = SR - R*R/K \qquad NR' = NR - N*R/K$$

$$SN' = SN - N*N/K \qquad YR' = YR - Y*R/K$$

$$YN' = YN - Y*N/K$$

The solutions then are $$A=(YR'*SN'-YN'*NR')/(SR'*SN'-NR'*NR')$$

$$E=(YR'*NR'-YN'*SR')/(SR'*SN'-NR'*NR')$$

$$D=-(Y-A*R+E*N)/K$$

Of interest are the following parameters:
e=E/A=deviation from nominal pulse period, should be close to zero.
The 4 values e(i) should be equal within a very small value.
d=D/A=ADC time shift in nsec For illustrative purposes, a single channel comprised of two digitizers was described and illustrated hereinabove. It is understood, of course, that more than two digitizers may be provided per channel, and more than one channel may be included in the digital oscilloscope.

Further, while the rising edge of the test waveform was selected for the above illustrations of delay computations, the falling edge may be used just as well. That is, the above algorithm may utilize either a positive or negative slope of the test waveform.

The above-described delay adjustment (calibration operation) may be performed on a real-time basis to interleave the digitized output in each channel, as well as between channels. The calibration procedure may take place when there is a change in temperature or at various stages of the operation of the oscilloscope: power-up, user mode change, periodically, etc.

It will be appreciated that the oscilloscope with the delay adjustment according to the present invention has resolution of better than 2 psec.

It will be further appreciated that in contrast to the prior art calibration procedures with long calibration time such as greater than 1 minute, the time for the above-described calibration operation is very small, and typically on the order of 1–2 seconds.

Having described specific preferred embodiments of the invention with reference to the accompanying drawings, it is to be understood that the invention is not limited to those precise embodiments, and that various changes and modifications may be effected therein by one skilled in the art without departing from the scope or the spirit of the invention as defined in the appended claims.

What is claimed is:

1. Apparatus for performing calibration, comprising:
a signal generator for generating a reference signal having a preselected period;
a digitizer for digitizing said reference signal to produce a plurality of digitized values having respective amplitudes; and
a programmable controller for obtaining, in each respective period, a temporal position of a digitized value with respect to a corresponding period of said reference signal, said programmable controller determining, based on the obtained temporal positions, a period, slope and delay corresponding to an approximate median value of the amplitudes such that sampling times of said digitizer are adjusted on the basis of the determined period, slope and delay.

2. The apparatus according to claim 1, wherein prior to obtaining the temporal positions, said programmable controller selects the digitized values within a predetermined amplitude range.

3. The apparatus according to claim 1, further comprising another digitizer for digitizing an input signal to produce digitized values that are interleaved with digitized values produced by the first-mentioned digitizer.

4. The apparatus according to claim 1, further comprising a memory unit for storing the digitized values.

5. The apparatus according to claim 1, further comprising a time base circuit for providing a clock signal to said digitizer to start a digitizing operation, said time base circuit being controlled by a control signal supplied by said programmable controller.

6. The apparatus according to claim 5, wherein the timing of said clock signal is adjusted in response to the supplied control signal based on the determined period, slope and delay.

7. The apparatus according to claim 1, wherein said digitizer includes a sample-and-hold circuit and an analog-to-digital converter.

8. The apparatus according to claim 1, wherein said reference signal is a square-wave signal.

9. A digital oscilloscope with a self-calibration operation, comprising:
an input port for receiving an input signal;
a signal generator for generating a reference signal having a preselected period;
a front end circuit for selecting one of said input and reference signals;
a digitizer for selectively digitizing said input signal or said reference signal to produce a plurality of digitized values having respective amplitudes; and
a programmable controller for obtaining, in each respective period, a temporal position of a digitized value of said reference signal with respect to a corresponding period of said reference signal, said programmable controller determining, based on the obtained temporal positions, a period, slope and delay corresponding to an approximate median value of the amplitudes such that sampling times of said digitizer are adjusted on the basis of the determined delay.

10. The apparatus according to claim 9, further comprising another digitizer for digitizing said input signal to produce digitized values that are interleaved with the digitized values of said input signal produced by the first-mentioned digitizer.

11. The apparatus according to claim 10, further comprising a time base circuit for providing a clock signal to the digitizers to start a digitizing operation, said time base circuit being controlled by a control signal supplied by said programmable controller.

12. The apparatus according to claim 11, wherein the timing of said clock signal is adjusted in response to the supplied control signal based on the determined period, slope and delay.

13. A method for performing calibration in a digital oscilloscope, comprising the steps of:

receiving an input signal;

generating a reference signal having a preselected period;

selecting one of said input and reference signals;

selectively digitizing said input signal or said reference signal to produce a plurality of digitized values having respective amplitudes;

obtaining, in each respective period, a temporal position of a digitized value with respect to a corresponding period of said reference signal; and determining, based on the obtained temporal positions, a period, slope and delay corresponding to an approximate median value of the amplitudes such that sampling times in said oscilloscope are adjusted on the basis of the determined period, slope and delay.

14. The method according to claim 13, further comprising the step of selecting the digitized values within a predetermined amplitude range prior to obtaining the temporal positions.

* * * * *